United States Patent
Bhawmik et al.

(10) Patent No.: US 6,463,561 B1
(45) Date of Patent: Oct. 8, 2002

(54) ALMOST FULL-SCAN BIST METHOD AND SYSTEM HAVING HIGHER FAULT COVERAGE AND SHORTER TEST APPLICATION TIME

(75) Inventors: Sudipta Bhawmik, Monmouth Junction, NJ (US); Kwang-Ting Cheng, Santa Barbara; Huan-Chih Tsai, Sunnyvale, both of CA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/408,371

(22) Filed: Sep. 29, 1999

(51) Int. Cl.[7] .................................................. G01R 31/28
(52) U.S. Cl. ........................ 714/733; 714/726; 714/729; 716/7
(58) Field of Search .................................. 714/733, 719, 714/720, 728, 726, 727, 729, 742, 734

(56) References Cited

U.S. PATENT DOCUMENTS

| | | | |
|---|---|---|---|
| 5,329,533 A | | 7/1994 | Lin .............................. 714/727 |
| 5,450,414 A | | 9/1995 | Lin .............................. 714/726 |
| 5,659,717 A | * | 8/1997 | Tse et al. ........................ 716/7 |
| 6,070,261 A | * | 5/2000 | Tamarapalli ................. 714/733 |
| 6,330,696 B1 | * | 12/2001 | Zorian et al. ................ 714/720 |

* cited by examiner

Primary Examiner—Emmanuel L. Moise
(74) Attorney, Agent, or Firm—Mendelsohn & Associates, P.C.

(57) ABSTRACT

An almost full-scan method and system for detecting faults in circuits can achieve higher fault coverages and significantly shorter test application time as compared with full-scan techniques. A special flip-flop selection of strategy is further described which permits implementation of the almost full-scan BIST method and system.

2 Claims, 8 Drawing Sheets

ALMOST FULL-SCAN BIST METHOD AND SYSTEM HAVING HIGHER FAULT COVERAGE AND SHORTER TEST APPLICATION TIME

BACKGROUND OF THE INVENTION

1. Field of the Invention

This invention relates to a method and system for detecting faults in electronic circuits by employing an almost full-scan method in which selected flip-flops are removed from the scan chains in order to improve overall performance.

2. Description of Related Art

The test application techniques used by most scan-based BIST architectures can be broadly characterized into two categories: test-per-clock and test-per-scan. In test-per-clock BIST, a test vector is applied and its response is captured in every clock cycle. FIG. 1(a) shows a simple test-per-clock configuration using an LFSR as a pattern generator and a MISR as a response compactor. Test patterns can also be applied using an LFSR and an idler register as shown in FIG. 1(b). The feature of this architecture is that all outputs (primary outputs or observation points) are connected to the MISR in parallel so that the responses are compressed in every clock cycle. This leads to shorter test application time. If the Circuit Under Test (CUT) is a sequential circuit, internal flip-flops can be configured as scan chains to improve the controllability or as a part of the MISR to increase the observability. However, configuring flip-flops as internal scan chains does not have the capability to observe the internal signals as regular scan flip-flops do. This is because if they are also used to capture the response, there is no time allowed for the response to be shifted out. That is, the response captured in one clock cycle may be corrupted by the responses of the subsequent clock cycles. Thus, to gain the observability from the internal scan chains, they must also be configured as a part of the MISR and consequently an XOR structure is necessary at every output of the scan flip-flop. This leads to a higher area overhead. In general, a large MISR is required for the test-per-clock BIST. Some of the popular test-per-clock BIST structures are BILBO based designs, and the circular self-test or circular BIST techniques. The primary advantage of these test-per-clock schemes is the relatively shorter test application time needed for achieving a desired fault coverage. The disadvantages are its high area overhead and performance degradation.

FIG. 2(a) shows a basic test-per-scan BIST configuration. The internal (or external) scan chain is used to apply test vectors as well as capture the responses. First, the test vector is applied after shifting in the vector by clocking the serial scan chains for l cycles, where l is the length of the longest scan chain. Next, the response is captured into the scan chains by clocking the scan flip-flops in the capture mode once. The response is then shifted out to a MISR while the next vector is shifted in. A typical test-per-scan BIST structure is the STUMPS architecture as shown in FIG. 2(b). STUMPS uses multiple parallel scan chains to apply test patterns and capture the responses. Test-per-scan architectures primarily require lower overheads (both area and performance), however the test application time increases as the length of the scan chain increases.

Useful discussions concerning the state of the art are disclosed in the following two (2) U.S. Patents, both assigned to AT&T Corp., Murray Hill, N.J. U.S. Pat. No. 5,329,533 entitled "Partial-Scan Built-in Self-Test Technique" and U.S. Pat. No. 5,450,414 entitled "Partial-Scan Built-In Self-Testing Circuit Having Improved Testability" both naming Chih-Jen Lin, Laurenceville, N.J. as the inventor.

Recently, a scan-based BIST scheme has been incorporated into pseudo-random BIST (called PSBIST). The BIST capability is built on top of a full-scan or partial-scan circuit by adding a test pattern generator, an output data compactor and a BIST controller. FIG. 3 shows the schematic of the PSBIST which is very similar to the STUMPS. The network N can be either a combinational circuit (full-scan) or a sequential circuit (partial-scan) with no cycles through flip-flops of size greater than one (called Near Acyclic Circuit or NAC). The test pattern generator consists of an LFSR and a phase shifter (PS). The output responses are passed through a space compactor (SC) which feeds to a MISR. Optional test points can be added to increase the fault coverage. The test application strategy of PSBIST combines both test-per-clock and test-per-scan methodologies. The circuit responses at the primary outputs are compressed by the MISR in every clock cycle similar to the test-per-clock scheme. The responses are also captured into the scan chains in every scan cycle (l+1 clock cycles, where l is the length of the longest scan chain) and then compressed by the MISR when the responses are shifted out as typical test-per-scan testing scheme does. By doing so, the desired fault coverage can be reached much earlier than the conventional test-per-scan approach with similar overheads.

SUMMARY OF THE INVENTION

It has been observed that under PSBIST with above mentioned test application strategy, scanning all flip-flops may not result in a version with the highest fault coverage under a practical limit on the length of the random sequence. Removing some flip-flops from the scan chains which have reasonable controllabilities and relatively high observabilities through the network's primary outputs may actually improve the fault coverage and significantly reduce the test application time. An example is given in Section A to illustrate this point.

Based on this observation, in Section B a strategy is proposed for identifying flip-flops to be removed from the scan chains for improving the network's random pattern testability under PSBIST architecture. The technique starts with a full-scan circuit and iteratively identifies flip-flops to be removed from the scan chains to increase the observability of the circuit so that faults activated during the scan cycles can be observed at the primary output. The influence of the circuit random testability due to un-scanning a flip-flop is captured by a cost function. Note that the objective of un-scanning flip-flops is not for area minimization—it's only for maximizing the random pattern testability. For most of circuits, only a small number of flip-flops will be un-scanned and thus the resulting circuits are almost full-scan circuits.

In Section C, experimental result s are presented to illustrate that the proposed methodology produces an almost full-scan circuit with a higher fault coverage and shorter test application time than its full-scan counterpart.

DETAILED DESCRIPTION OF THE PREFERRED EMBODIMENT

During the course of this description like numbers will be used to identify like elements according to the different drawings and figures which illustrate the invention.

In order to better understand the invention it is first useful to understand certain unique observations about PSBIST. Those are set forth in Section A below. An understanding of the observations in Section A leads to a better appreciation of the inventor's solution, namely the identification of selective non-scan flip-flops as described in Section B. Lastly, the improved results of the non-scan flip-flops selection described in Section B are set forth in the experimental results shown in Section C.

Section A—Observations of PSBIST

Although PSBIST combines both advantages of the test-per-clock and test-per-scan BIST strategies, the lack of the direct observabilities of scan flip-flops may degrade its efficiency.

Figure 1A:
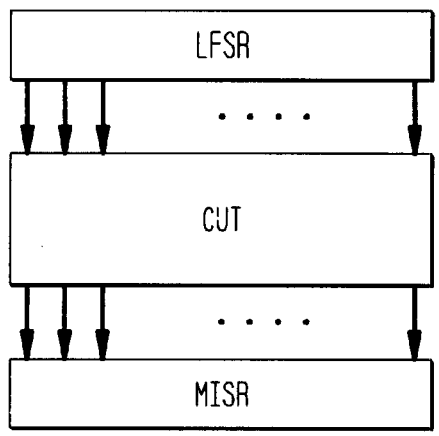
FIG. 1A illustrates a test-per-clock BIST architecture employing an LFSR.
Figure 1B:
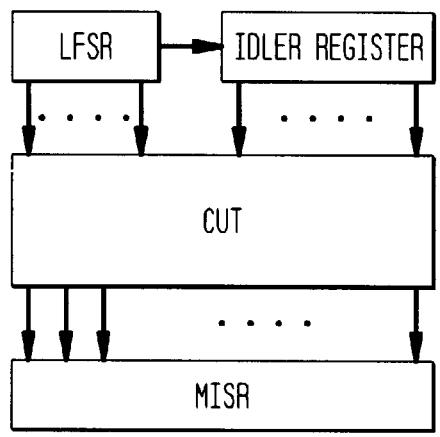
FIG. 1B illustrates another test-per-clock BIST employing an LFSR and an idler register.
Figure 2A:
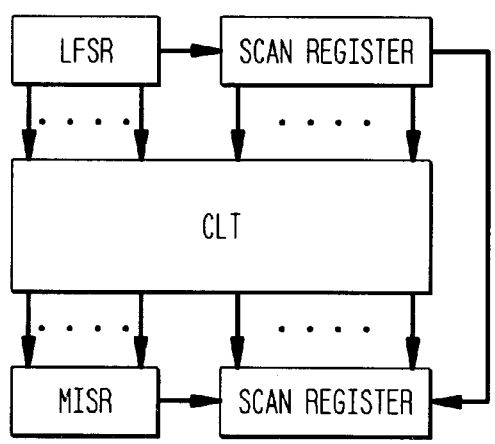
FIG. 2A illustrates a test-per-scan configuration.
Figure 2B:
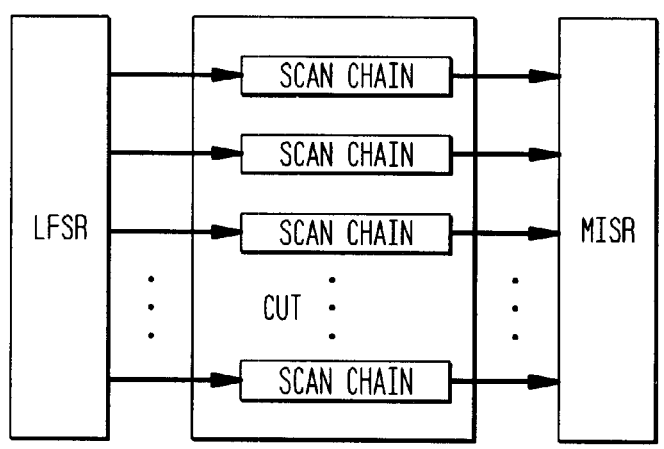
FIG. 2B illustrates a STUMP test-per-scan BIST configuration.
Figure 3:
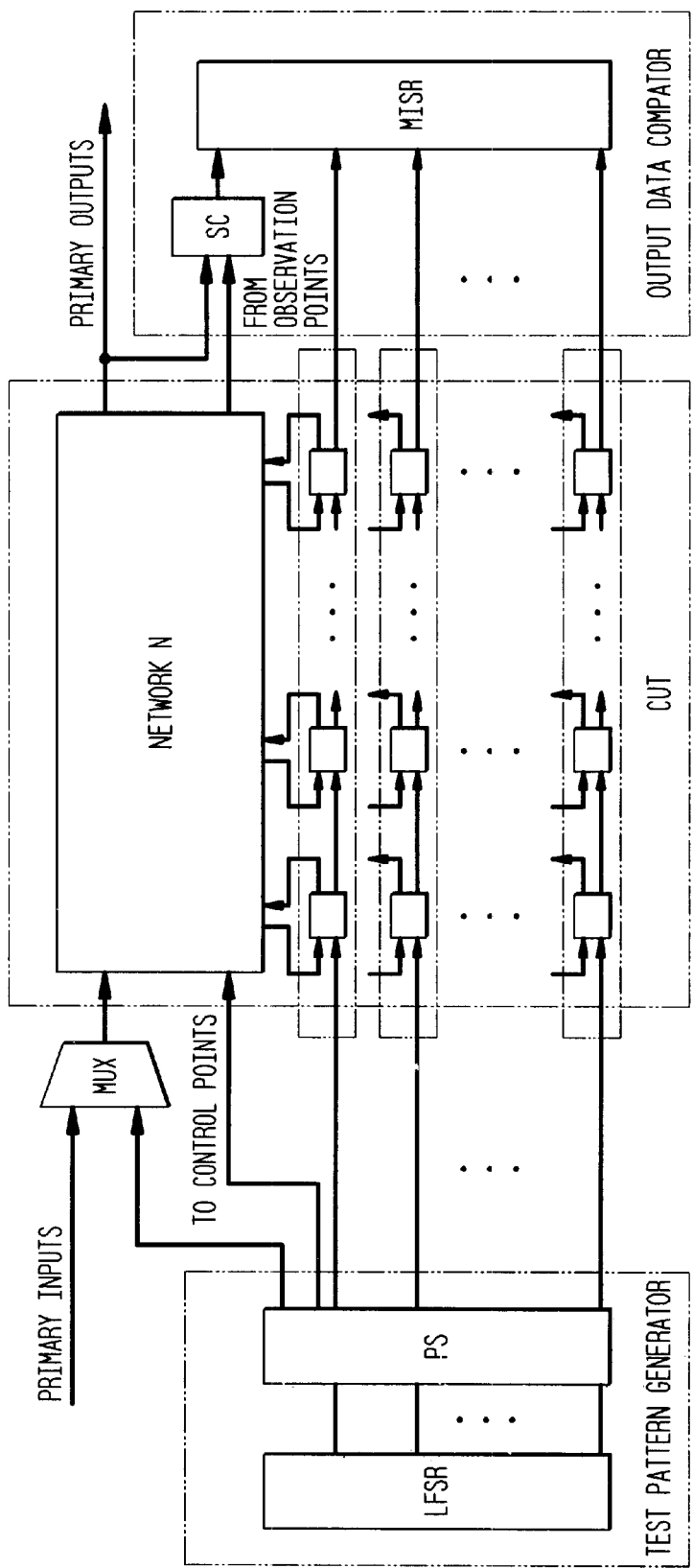
FIG. 3 illustrates a partial-scan BIST, also referred to as a PSBIST architecture.
Figure 4A:
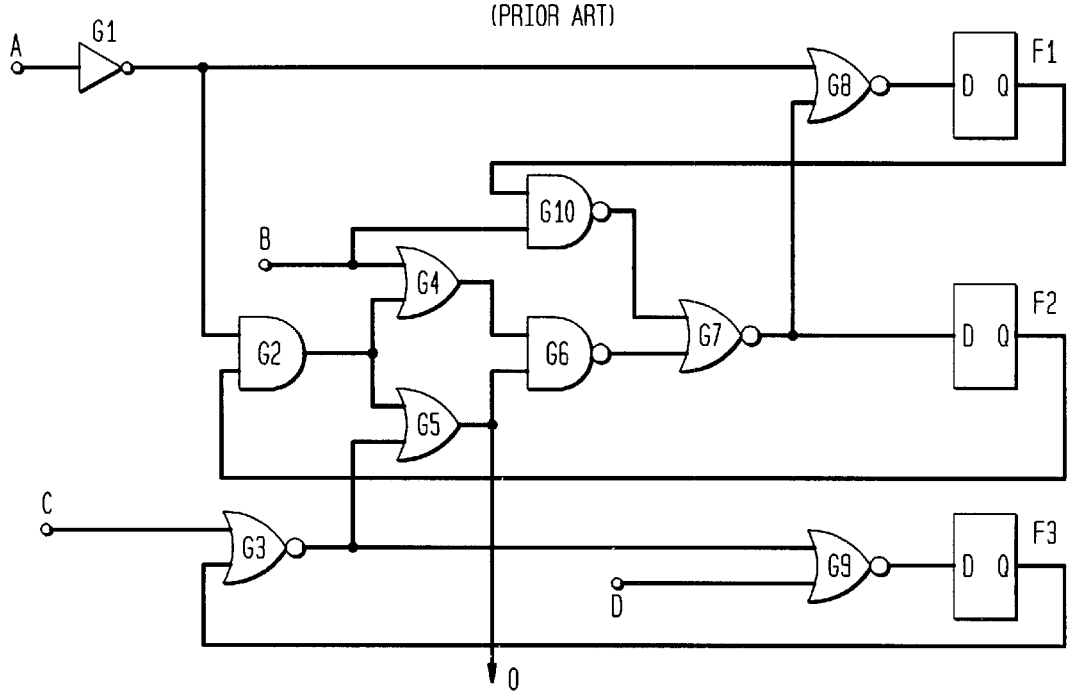
FIG. 4A illustrates a typical circuit under test (CUT).
Figure 4B:
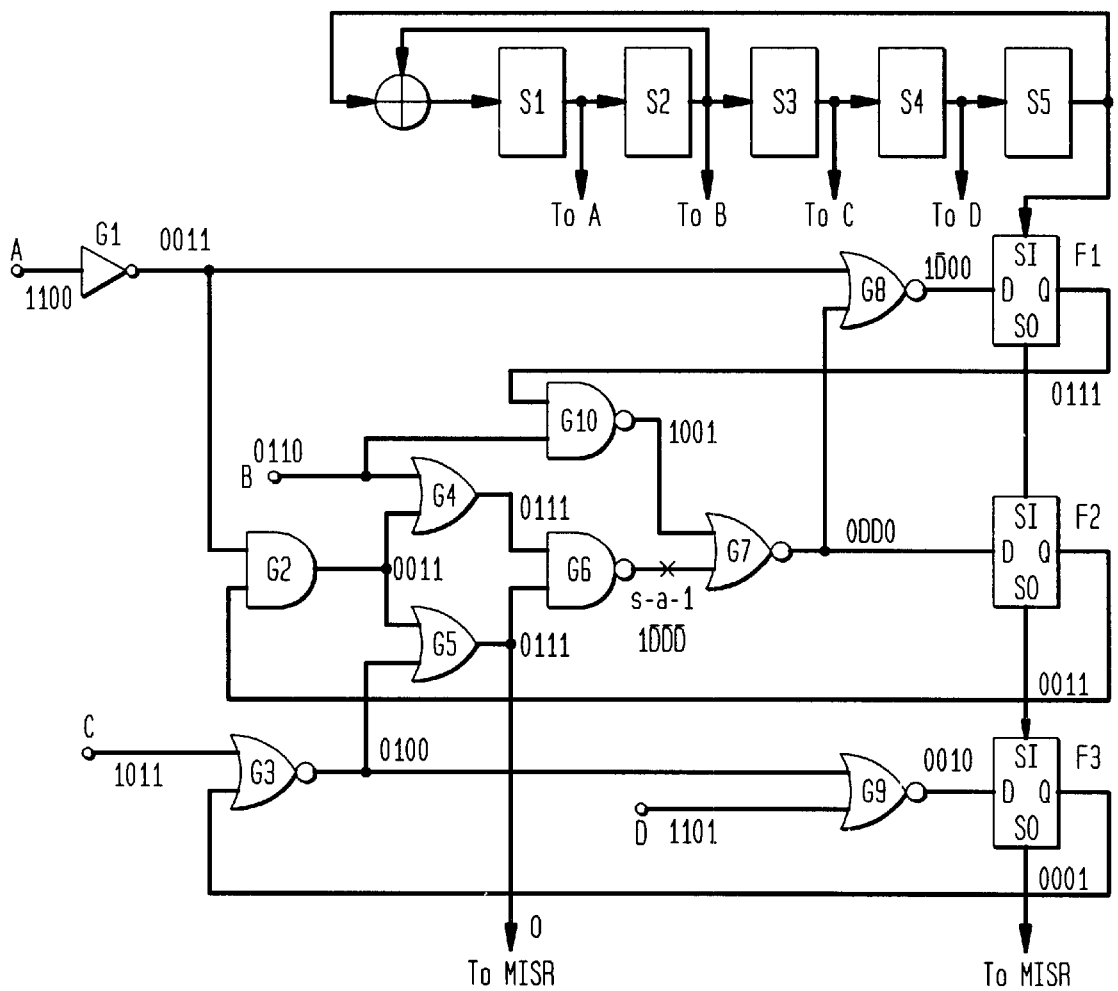
FIG. 4B illustrates the testing of a full-scan version of the CUT of FIG. 4A.

Consider the example shown in FIG. 4. The CUT has four primary inputs (A, B, C, and D), one primary output (O) and three flip-flops (F1, F2 and F3). First convert CUT according to PSBIST by scanning all flip-flops (i.e. N in FIG. 3 is a combinational circuit) and use an LFSR with the characteristic polynomial $p(x)=x^5+x^2+1$ as the test pattern generator. The modified circuit is shown in FIG. 4(b). For simplicity, the phase shifter, space compactor, and MISR are not included in the circuit. During the testing, the circuit response is captured into the scan chain in every four clock cycles (three clock cycles in scan-shifting mode one clock cycle in capture mode) then observed at the output of the scan chain. In addition, the response is observed at the primary outputs in every clock cycle. Assume that the test of CUT starts at time $t_0$. The values of the flip-flops in each clock cycle are shown in the table in FIG. 4(b). The values of each signal from time $t_0$ to time $t_3$ are also shown in FIG. 4(b) in the format of $t_0$ $t_1$ $t_2$ $t_3$. Consider the stuck-at-1 fault, f, at the output of G6. After three clock cycles, the circuit response is about to be captured into the scan chain. However, even thought has been activated and propagated to the data inputs (D) of F2 (at $t_1$ and $t_2$) and F1 (at $t_1$) during the scan mode, the fault effect cannot be captured into the flip-flops because no erroneous values appear at the data inputs of the flip-flops at $t_3$ (when the circuit is in the capture mode). Also, no fault effects are propagated to the primary output O during time $t_0$ to $t_3$. Therefore, f cannot be detected within three clock cycles under this configuration.

Figure 4C:
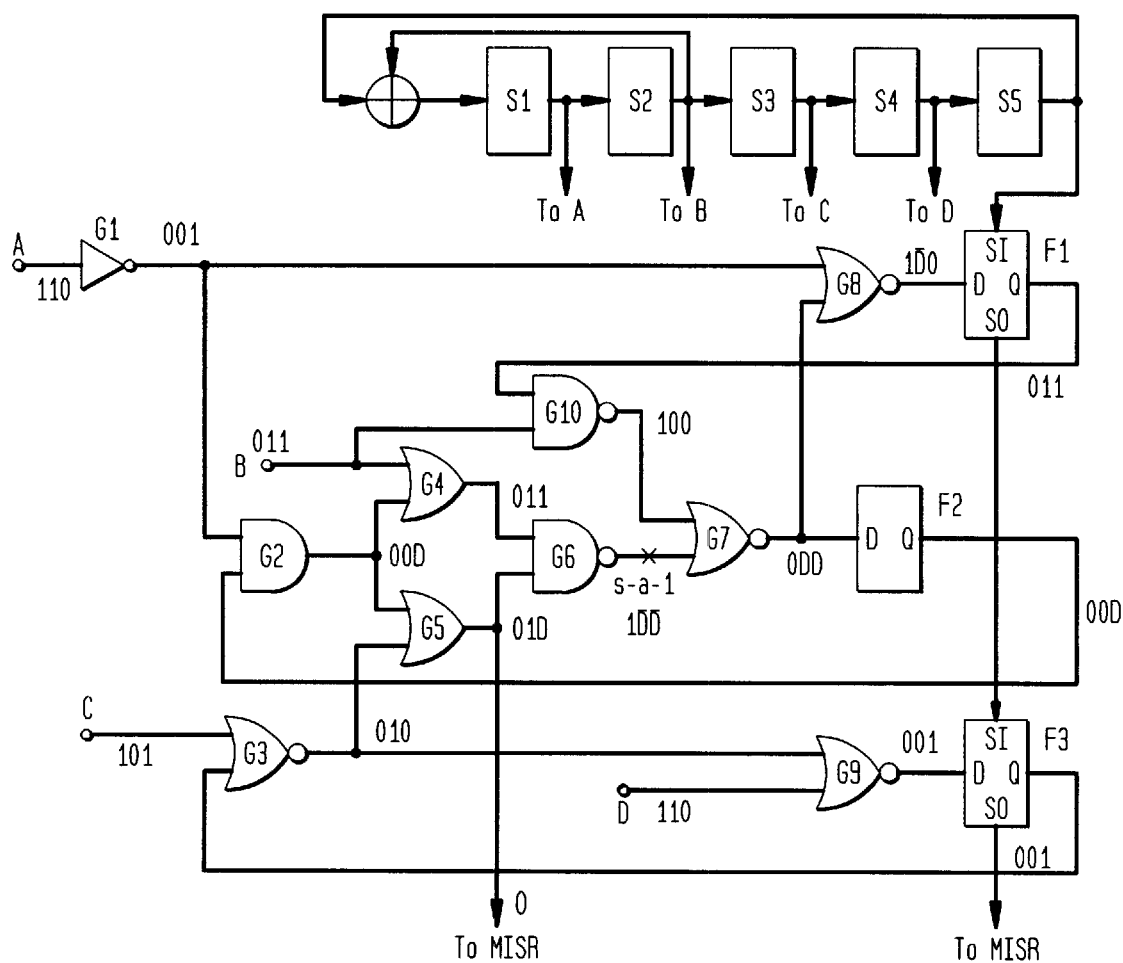
FIG. 4C illustrates the testing of a partial-scan version of the CUT of FIG. 4A.

Next, suppose F2 is not scanned as shown in FIG. 4(c) (In this case, N in FIG. 3 is a sequential circuit with one flip-flop F2). The initial states of the test pattern generator and flip-flops are assumed to be the same as that in FIG. 4(b). During the BIST mode, the circuit response is captured into the scan chain in every three clock cycles because the length of scan chain is two. The response is also observed at the primary output in every clock cycle. The values of every signal from $t_0$ to $t_2$ are shown in FIG. 4(c). After two clock cycles, an erroneous value which was propagated to the data input of F2 at $t_1$ is observed via the primary output O at $t_2$. Thus f is detected in two clock cycles.

This example illustrates that scanning a flip-flop may actually deteriorate the observability of its data input. In PSBIST, the values at the primary outputs are continuously observed in every clock cycle while the values appear at the data input of a scan flip-flop are captured only in every l+1 clock cycles. Therefore, the observability of the data input (i.e. the pseudo output) of a scan flip-flop is much smaller than that of a primary output, especially when the scan chain is long. A non-scan flip-flop will capture the response at its data input in every clock cycle. Once a fault effect is captured, if the observability of the non-scan flip-flop is reasonably high, the response may then be propagated to the primary outputs which are observed in every clock cycle. Hence, it may be beneficial not to scan a flip-flop with reasonably high observability through the primary outputs to increase the overall random testability of the circuit.

In scan-based BIST, most of the test application time is spent on loading and unloading the scan chains. During that period, there are numerous vectors exercising the circuit and there is a great chance that many faults are actually activated and propagated to data inputs of scan flip-flops but cannot be captured. To take advantage of these large number of vectors for fault detection, the inventors have determined that it is possible to smartly designate some flip-flops as non-scan flip-flops to increase the observability of the circuit so that some fault effects can be captured and observed quickly at the primary outputs and in turn boost the fault coverage with a shorter test sequence. In other words, partial-scan BIST (actually it's almost full-scan BIST because the number of non-scan flip-flops is usually small) may provide higher quality test result than purely full-scan BIST in terms of both fault coverage as well as test application time. In the following, an algorithm or method is proposed to automatically identify those flip-flops those should not be scanned for PSBIST.

Section B—Non-Scan Flip-Flops Identification

There are two general approaches to identify scan flip-flops. The first one starts from a non-scan circuit, then finds the flip-flops to be added to the scan chains. Conversely, one can start from a full-scan circuit, then find the flip-flops to be removed from the scan chains. Because it is intended to resolve the lack of the observability of a scan flip-flop, it is easier to address the problem using the second approach.

Removing flip-flops from scan chains affects the observability as well as the controllability of the circuit. Attempting to increase the observability by un-scanning a flip-flop may not justify the loss of controllability of that flip-flop. Therefore, a cost function which consider both controllability and observability of the circuit is preferred. To capture the pseudo-random testability of a circuit, a cost function can be described as follows:

$$U = \frac{1}{|F|} \sum_{i \in F} \frac{1}{Pd_i} \quad (1)$$

In Equation (1), F is the fault set, |F| is the cardinality of F, and $Pd_i$ is the detection probability of fault i. For stuck-at fault model, $Pd_i$ can be estimated by one of following two equations:

$$Pd_{S/0} = C_s \cdot O_s \text{ for stuck-at-0 fault at signal } s; \quad (2),$$

$$Pd_{S/0} = (1-C_S) \cdot O_S \text{ for stuck-at-1 fault at signal } s; \quad (3),$$

where $C_s$ and $O_s$ are 1-controllability and observability of signal s, respectively. The cost function U can be viewed as the average expected length of random patterns for detecting a single fault in F because $1/Pd_i$ can be interpreted as the expected number of random patterns for detecting fault i. $C_s$ and $O_s$ can be efficiently estimated using COP.

Figure 5:
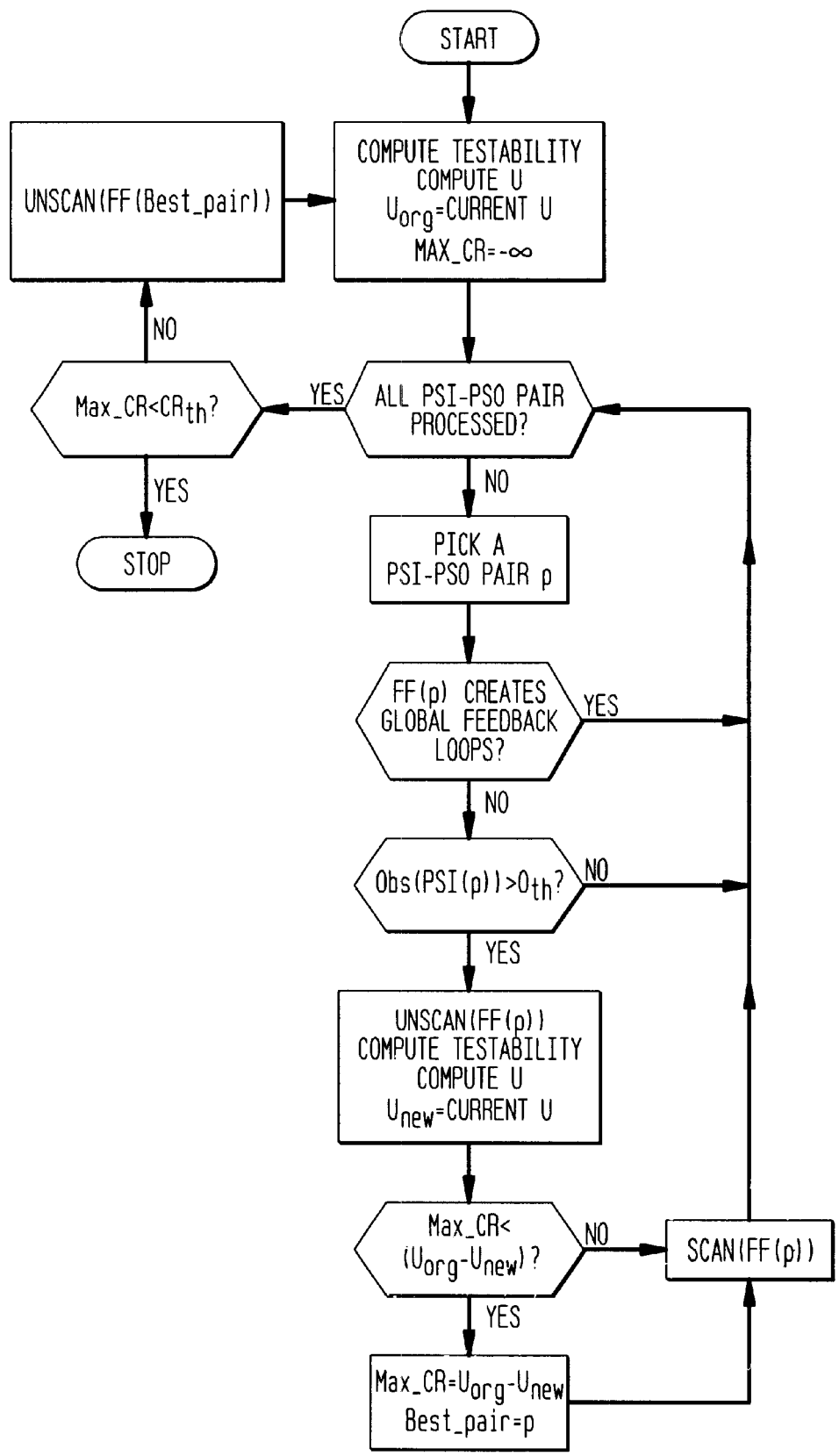
FIG. 5 is a flow chart describing the non-scan flip-flop identification technique, also referred to as "BISTSCAN", for a PSBIST.

In the following discussion, the output and the data input of a scan flip-flop are referred to as the pseudo primary input (PSI) and the pseudo primary output (PSO), respectively. Furthermore, the pair of PSI and PSO associated with the same flip-flop is referred to as a PSI-PSO pair. FIG. 5 shows the non-scan flip-flop identification algorithm or method (called BISTSCAN) for PSBIST. The notations used in the algorithm are listed in FIG. 5 to the right of the flow chart. The algorithm removes flip-flops from the scan chain in a greedy manner. At each iteration, it first computes the testability (both controllability and observability) of the circuit based on COP and records the cost function U. In computing of the circuit observability, the observability of PSO is set to 1/(l+1) (as opposed to 1 for the primary outputs) because a scan flip-flop captures the value at its data input every l+1 cycles, where l is the length of the longest scan chain. After that, those flip-flops (1) which will not create global feedback loops if not scanned (a global feedback loop is a loop containing at least two non-scan flip-flops) and (2) whose corresponding PSIs have observabilities greater than a given observability threshold ($O_{th}$) are considered as candidates. Note that un-scanning flip-flops which create global feedback loops will drastically reduce the testability of the circuit. For every candidate, temporarily remove it from the scan chain, re-compute the circuit random testability and in turn the new cost function $U_{new}$ to find the cost reduction ($U_{org}-U_{new}$), then finally put it back to the scan chain. The largest cost reduction (Max_CR) and the best candidate (Best_pair) are continuously updated as the algorithm proceeds. Usually, the reduction of U does reflect the improvement of the fault coverage. However, because the COP signal controllability, signal observability and in turn the detection probability of a fault are just estimates, hence, if the value of $U_{org}$ is large and the reduction of $U_{org}$ is relatively small, it may not guarantee a true improvement on the fault coverage. For this reason, at the final step, the largest cost reduction is compared to a specified improvement threshold ($CR_{th}$). If the improvement (cost reduction) is marginal, the algorithm stops, otherwise, the best candidate is removed from the scan chain and the algorithm iterates.

Figure 6A:
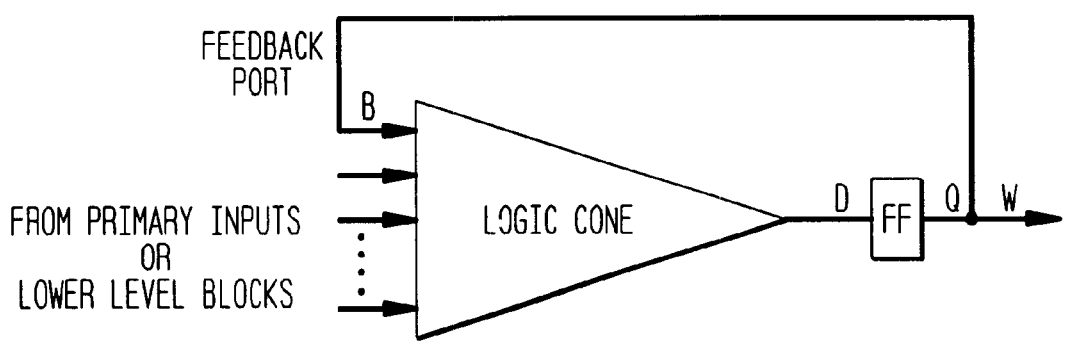
FIG 6A illustrates a self-loop flip-flop block.
Figure 6B:
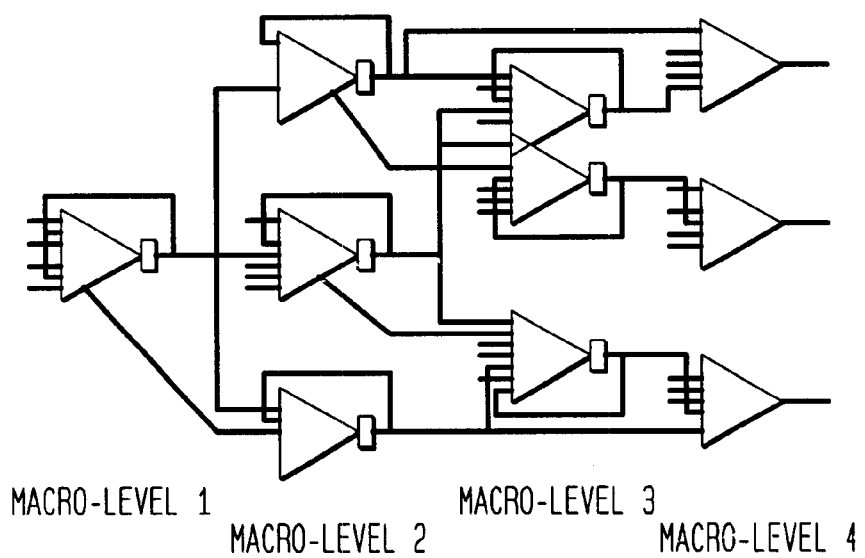
FIG. 6B is an example of a nearly acyclic circuit, also referred to as an "NAC" after decomposition.
Figure 7:
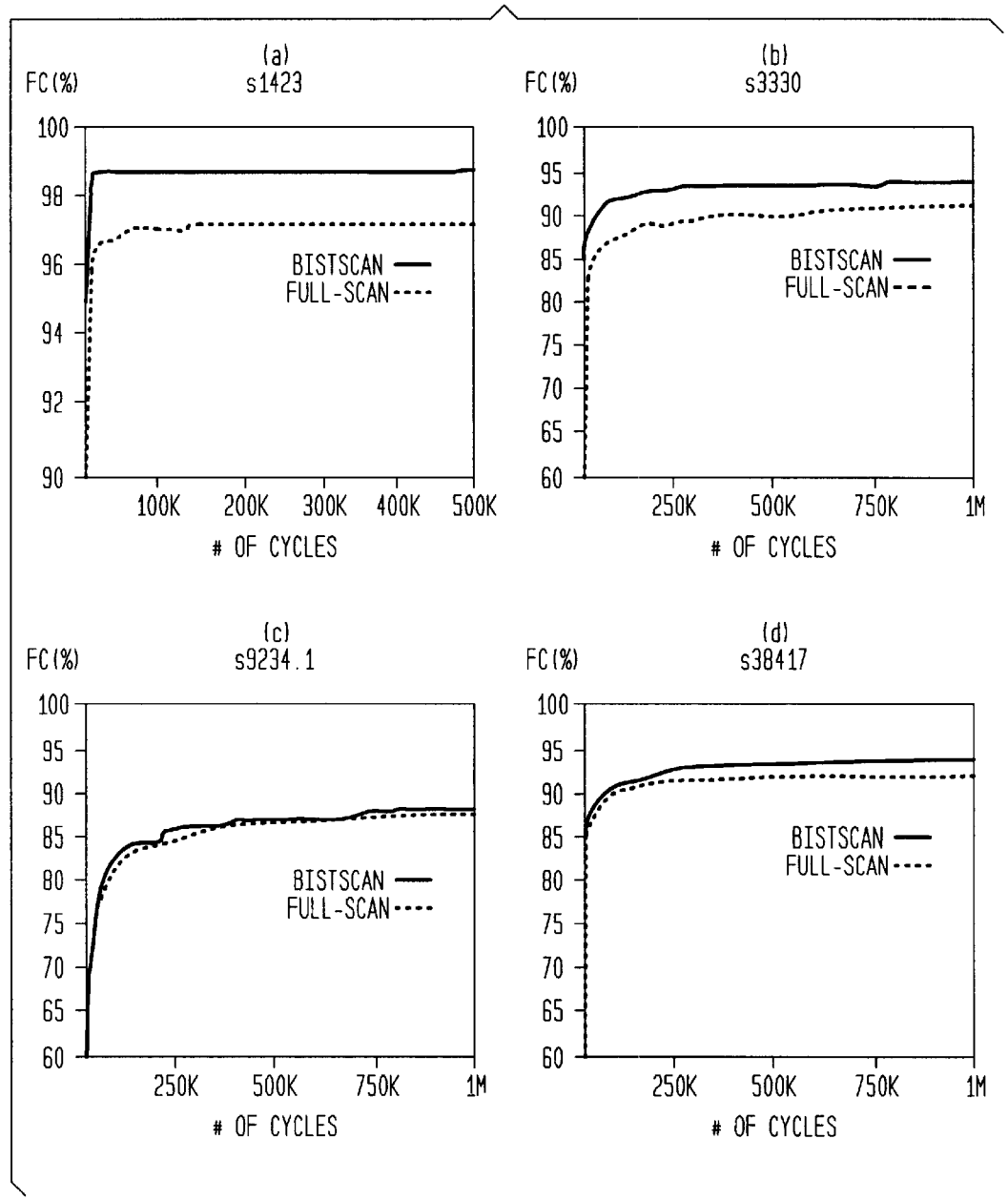
FIGS. 7a–7d illustrate fault coverage curves for some ISCAS89 benchmark circuits, namely models No. s1423, s3330, s9234.1 and s38417 respectively.

Since feedback loops containing one flip-flop (called self-loop flip-flop) are allowed in the network N shown in FIG. 3, it is necessary to extend COP testability calculation for circuits with self-loops (NACs). A symbolic testability computation method is used to compute testability for an NAC. To compute the COP values of an NAC, the circuit is first levelized according to the logic levels of self-loop flip-flops (called macro level). Then the circuit is decomposed into several self-loop flip-flop blocks. FIG. 6 shows a self-loop flip-flop block and a decomposed NAC. The COP controllabilities and observabilities of signals within a self-loop flip-flop block are computed by first assigning a symbolic value, say x, to the feedback ports (B) and then propagating x to the internal signals of the self-loop flip-flop block. The COP values of internal signals could be a polynomial of x. The higher order exponents of x are suppressed to eliminate the inaccuracy caused by the correlation due to the re-convergent fanout originated from the feedback ports. Therefore, once x is propagated to the self-loop flip-flop, it can be computed by simply solving a linear equation x=ax+b, where a and b are some constants. The calculation of COP controllability is performed block by block from lower macro level blocks to higher macro level blocks and the observability is computed block by block from higher macro level blocks to lower macro level blocks without iterations.

Section C—Experimental Results

The algorithm and related method and technique were implemented and experiments conducted on a large set of ISCAS89 benchmark circuits. The observability threshold ($O_{th}$) is set to 0.5 throughout the experiments (i.e. only those flip-flops whose random-pattern observabilities are greater than 0.5 will be considered as non-scan flip-flop candidates). The improvement threshold ($CR_{th}$) is set to 0 for all circuits except s5378 and s38417. It is set to 200 for s5378 and 1000 for s38417 to improve the efficiency because for these two circuits, the cost reductions of most candidates are very small. First the proposed algorithm was applied to identify a set of non-scan flip-flops. Then this information is passed to a BIST tool psb2 to automatically incorporate the BIST capability into the circuit. psb2 is a product of Lucent Technologies, Inc. The longest length of scan chain in the modified circuit is set to 10 and a 21-stage LFSR is used as the test pattern generator except s953. For s953, a 19-stage LFSR is used because the total number of primary inputs and scan chain inputs is only 19. For comparison, both the almost full-scan circuit using BISTSCAN and the purely full-scan version of the circuits are generated. Fault simulation is performed on both and the test application schemes for both are identical. That is, the circuit responses are observed in every clock cycle through the primary output and they are also observed in every l+1 clock cycles via the scan chains.

TABLE 1

Fault coverage comparison of full-scan and BISTSCAN

| | Full-scan | | BISTSCAN | | CPU |
|---|---|---|---|---|---|
| Circuit | # of FFs | FC (%) | # of scan FFs | FC (%) | (sec.) |
| s953 | 29 | 97.03 | 5 | 98.01 | 18 |
| s1423 | 74 | 97.11 | 72 | 98.73 | 15 |
| s1512 | 57 | 92.28 | 38 | 92.72 | 20 |
| s3271 | 116 | 99.18 | 96 | 99.83 | 27 |
| s3330 | 132 | 91.17 | 104 | 94.05 | 48 |
| s3384 | 183 | 97.25 | 163 | 97.33 | 24 |
| s5378 | 179 | 96.68 | 171 | 96.66 | 37 |
| s6669 | 239 | 99.79 | 118 | 99.87 | 836 |
| s9234.1 | 211 | 87.27 | 202 | 87.99 | 36 |
| s15850.1 | 534 | 88.08 | 500 | 89.57 | 351 |
| s38417 | 1636 | 92.51 | 1628 | 94.43 | 698 |
| Ave. | | 1.00* | 94.40 | 0.91* | 95.38 | — |

*Normalized with respect to the total number of flip-flops.

Table 1 shows the fault coverage comparison of full-scan and BISTSCAN. The total number of flip-flops in each circuit is shown in Column 2 and the fault coverages (FC) of the full-scan circuits are shown in Column 3. The fault coverage is computed by applying one million clock cycles (except for the smallest circuit s953) to the LFSR which applies test patterns to the CUT. For s953, 500K clock cycles are applied. The number of scan flip-flops in every almost full-scan circuit is shown in Column 4. Each almost full-scan circuit is also fault simulated with one million clock cycles (500K for s953) and the fault coverage is recorded in Column 5. The last column shows the run time of BISTSCAN for each case. It is measured on a Sun Sparc-station 20. For benchmark circuits s838 and s4863, the algorithm reports that full-scan is the best strategy, therefore they are not listed in Table 1. By un-scanning a few flip-flops, the increased fault coverage could be very significant. For example, removing only 2 flip-flops from the scan chains for s1423, the fault coverage increases 1.6%. For s1423, there are 23% of all signals having combinational paths to those 2 selected un-scanned flip-flops and among them, more than 6% must go through these 2 flip-flops for fault detection. Therefore, in this case, faults associated with these 6% more signals have chances to be detected during the scan mode by un-scanning 2 flip-flops. In fact, these 2 flip-flops are connected to the primary outputs via buffers and do not fanout to other logic. Thus, scanning them simply wastes the observability provided by the primary outputs. In general, un-scanning flip-flops with reasonable controllabilities and high observabilities through the primary outputs can help fault detection during the scan mode. This table clearly shows the improvement on fault coverages using BISTSCAN with a practical test length. The average fault coverage improvement is roughly 1%.

TABLE 2

Test Length Comparison of Full-Scan and BISTSCAN

| Circuit | Full-scan FC (%) | Cycle | BISTSCAN FC (%) | Cycle | Test Length Reduction* (%) |
|---|---|---|---|---|---|
| s953 | 97.03 | 214025 | 97.10 | 92537 | 56.76 |
| s1423 | 97.11 | 127725 | 97.11 | 3812 | 97.02 |
| s1512 | 92.38 | 252737 | 92.25 | 50862 | 79.88 |
| s3271 | 99.18 | 745687 | 99.20 | 23162 | 96.89 |
| s3330 | 91.17 | 868525 | 91.17 | 55100 | 93.66 |
| s3384 | 97.25 | 435250 | 97.20 | 506625 | −16.4 |
| s5378 | 96.66 | 848887 | 96.66 | 745565 | 12.17 |
| s6669 | 99.79 | 79537 | 99.80 | 1625 | 97.96 |
| s9234.1 | 87.27 | 965200 | 87.39 | 691662 | 28.34 |
| s15850.1 | 88.08 | 987825 | 88.11 | 163687 | 83.47 |
| s38417 | 92.51 | 987075 | 92.54 | 234437 | 76.25 |
| Ave. | 94.40 | — | 95.38 | — | 64.19 |

*[(earliest cycle for Full-Scan) − (earlier cycle or BISTCAN)]/(earlier cycle for Full-Scan).

The test length comparison of full-scan and BISTSCAN is illustrated in Table 2. The comparison let both full-scan and and almost full-scan circuits achieve comparable fault coverages as shown in Columns 2 and 4, and then record the earliest clock cycle at which the circuit reach the final fault coverage as shown in Columns 3 and 5. The test length reduction (in %) is given in the last Column. Although the results show the test length reductions are circuit dependent, for most of them, the reductions are very significant. The average test length reduction is approximately 64.19% for the same level of fault coverage. Note that the length of the longest scan chain (10) is identical for almost and pure full-scan circuits except for s953 whose scan chain length reduces from 10 to 5 in the almost full-scan version. Therefore, the reduction of the test application time is not from reducing scan chain length but from observing fault effects during the scan mode. It is worth noting that the reduction of test application time for BIST is desirable. This is because (1) it provides faster test throughput; (2) if BIST is executed in multiple sessions (e.g. for multiple clock designs) it leads to faster BIST executions. Moreover, for very large circuits, due to the large number of internal nodes with respective to relatively small number of the primary outputs, the effectiveness of BISTSCAN may be limited. In this case, other DFT techniques such as test point insertion can be combined with the proposed approach to further boost the test quality.

FIGS. 7a–7d respectively show the fault coverage vs. test length curves for s1423, s3330, s9234.1 and s38417. Similar curves can be found for other circuits. The fault coverage of the almost full-scan circuit using BISTSCAN is higher with a fewer number of cycles than the corresponding full-scan circuit. It is our conjecture that if the test length is very long (in the range of hundreds of millions of cycles), both methods may eventually achieve roughly the same level of fault coverage. This is because when test length increases, the number of combinational test vectors applied to the circuit also increases. Therefore, the chance of fault effects observed through scan chains increases. However, the increase rate could be very small and inversely proportional to the length of the scan chain. As revealed in FIG. 7, the fault coverage curves of circuits using BISTSCAN saturate much faster than their full-scan counterparts. Therefore circuits using BISTSCAN can reach the target fault coverage much faster than the corresponding full-scan circuits. As the result, the test application time is drastically reduced. From Tables 1 and 2, the results clearly demonstrate that the proposed algorithm effectively identifies the non-scan flip-flops. The improvement on both fault coverages and test application time shows the advantage of observing large number of activated faults during the scan mode.

TABLE 3

Comparison of PASCANT and BISTSCAN

| Circuit | Total/Scan | Full-scan | PASCANT (%) | BISTSCAN % |
|---|---|---|---|---|
| s953 | 29/5 | 97.03 | 94.37 | 98.01 |
| s1423 | 74/72 | 97.11 | 96.80 | 98.73 |
| s1512 | 57/38 | 92.28 | 78.45 | 92.72 |
| s3271 | 116/96 | 99.18 | 99.81 | 99.83 |
| s3330 | 132/104 | 91.17 | 90.18 | 94.05 |
| s3384 | 183/163 | 97.25 | 94.23 | 97.33 |
| s5378 | 179/171 | 96.68 | 96.56 | 96.66 |
| s6669 | 239/118 | 99.79 | 99.77 | 99.87 |
| s9234.1 | 211/202 | 87.27 | 87.37 | 87.99 |
| s15850.1 | 534/500 | 88.08 | 88.00 | 89.57 |
| s38417 | 1636/1628 | 92.51 | 94.42 | 94.43 |
| Ave. | — | 94.40 | 92.72 | 95.38 |

PASCANT is used to select scan flip-flops and perform similar experiments under PSBIST architecture. PASCANT is a scan flip-flop selection algorithm which is based on cycle-breaking and intends to simplify deterministic ATPG. For comparison, the numbers of scan flip-flops selected by PASCANT are set to be identical to those selected by BISTSCAN shown in Table 1. The maximum length of scan chains (10) and the size of LFSR (21) are set to be identical for both approaches as well. Table 3 shows the results of comparison. The fault coverages for circuits using PASCANT are shown in Column 4 and the results of full-scan and BISTSCAN are taken from Table I and repeated in Columns 2 and 5, respectively. All scanned circuits are fault simulated under PSBIST architecture with one million clock cycles (500K for s953). The results indicate that the fault coverages of the partial-scan circuits using PASCANT are usually lower than the corresponding full-scan circuits (8 out of 11 cases). The loss of fault coverage could be as large as 14% (s 1512). In other words, high fault coverage is not guaranteed using PASCANT for PSBIST. Therefore, existing partial-scan techniques for deterministic ATPG are not suitable for pseudo-random testing. Even though PASCANT selects the flip-flops based on some deterministic criteria (such as sequential loops and depth), beside those scan flip-flops for breaking sequential loops, all other scan flip-flops can be considered random selection from the viewpoint of pseudo-random BIST. Therefore, the comparison made in Table 3 is essentially the comparison of BISTSCAN with a random selection strategy.

In conclusion, it has been shown that under PSBIST architecture, full-scan does not necessarily result in the highest fault coverage—partial-scan (almost full-scan in most cases) may beat full-scan in terms of both fault coverage and test application time. The observation is illustrated by an example. A method is further proposed to effectively identify non-scan flip-flops which can result in an increase in the network's random testability during the scan mode. Through the experiments, it is demonstrated that this methodology achieves a higher fault coverage with significantly shorter test application time. The experimental results also indicate that existing partial-scan flip-flop selection algorithm for easy deterministic ATPG is not effective for PSBIST. The observability of the CUT should be considered during the scan flip-flops selection process if pseudo-random testing is used.

We claim:

1. A pseudo-random built in self test (PSBIST) method for detecting faults in a circuit under test (CUT) characterized by a combinational part and a sequential part including a scan chain of sequentially scannable memory elements ($FF_1$, $FF_2$, $FF_3$ etc), said method comprising the steps of:
   a) temporarily removing one or more selected memory elements $FF_i$ from said scan chain;
   b) calculating the circuit testability of said CUT with each said memory elements $FF_i$ removed to determine the cost function of each removed elements $U_{new}$ and the cost reduction $U_{org} - U_{new}$;
   c) repeating steps (a) and (b) above to determine the largest cost reduction Max-CR and the one or more best candidates $FF_i$ for removal from said scan chain; and;
   d) test scanning said CUT with said one or more best candidates $FF_i$ removed from said scan, wherein said test scan is an almost full-scan BIST and achieves higher fault coverage in a shorter test application time than full scan.

2. The method of claim 1 wherein this cost function $U_{new}$ of step (b), is calculated by the following step:

$$U_{new} = \frac{1}{|F|}\left(\sum_{i \in F} \frac{1}{Pd_i}\right)$$

where $F$ = the fault set
$|F|$ = the cardinality of $F$
$Pd_i$ = Detection probability of fault.

\* \* \* \* \*